United States Patent [19]
Fukuchi et al.

[11] Patent Number: 5,867,819
[45] Date of Patent: Feb. 2, 1999

[54] AUDIO DECODER

[75] Inventors: Hiroyuki Fukuchi; Hirofumi Sato, both of Tokyo, Japan

[73] Assignee: Nippon Steel Corporation, Tokyo, Japan

[21] Appl. No.: 722,948

[22] Filed: Sep. 27, 1996

[30] Foreign Application Priority Data

Sep. 29, 1995 [JP] Japan ................................. 7-276293
Jan. 12, 1996 [JP] Japan ................................. 8-022107

[51] Int. Cl.$^6$ ................................................. H04N 7/26
[52] U.S. Cl. ........................ 704/500; 704/503; 704/501; 704/504
[58] Field of Search ................................ 704/500, 503

[56] References Cited

U.S. PATENT DOCUMENTS

| | | | |
|---|---|---|---|
| 4,092,603 | 5/1978 | Harrington | 325/473 |
| 4,291,310 | 9/1981 | Kruger | 343/16 R |
| 4,369,336 | 1/1983 | Agnello | 179/1 J |
| 4,472,745 | 9/1984 | Foerster | 358/310 |
| 5,164,980 | 11/1992 | Bush | 379/53 |
| 5,394,249 | 2/1995 | Shimoda | 358/335 |
| 5,539,452 | 7/1996 | Bush | 348/17 |
| 5,561,608 | 10/1996 | Shimoda | 364/514 |

OTHER PUBLICATIONS

Furui et al., Advances in Speech Signal Processing, Marcel Dekker, Inc. 1992, pp. 109–141.

Primary Examiner—David R. Hudspeth
Assistant Examiner—Daniel Abebe
Attorney, Agent, or Firm—Pollock, Vande, Sande & Amernick

[57] ABSTRACT

An audio decoder which can reduce a memory circuit capacity necessary for performing a series of decoding processes and can perform a down mixing. The audio decoder decodes audio data of a plurality of channels encoded in a frequency domain by using a time base to frequency base conversion. After a down mixing process was performed to the audio data of the frequency domain by frequency domain down mixing circuit, it is converted into audio data of a time domain by frequency base to time base converting circuit, thereby reducing memories by the number corresponding to the reduced number of channels. Further, by executing an inverse quantizing process of each channel and a frequency base to time base converting process of each channel by pipeline processes, a work buffer can be shared in both of the processes.

18 Claims, 14 Drawing Sheets

AUDIO DECODER

BACKGROUND OF THE INVENTION

1. Field of the Invention

The present invention relates to an audio decoder for expanding audio data compressed by using a data compressing technique and, more particularly, to an audio decoder for expanding, for example, compressed audio data that is transmitted through a transmission path or reproduced from a recording medium.

2. Description of the Related Art

Hitherto, various methods for highly efficient encoding of an audio signal have been known. For example, there is a method whereby an audio signal is converted by using a time base to frequency base conversion to convert a signal in a time domain into a signal in a frequency domain and a data compression adapted to a human auditory sense in each frequency band is executed. As such a method for the time-base to frequency-base conversion, for example, a method using a sub-band filter or an MDCT (Modified Discrete Cosine Transform) can be mentioned.

Outlines of the sub-band filter encoding method and MDCT encoding method have been disclosed in, for example, "Advances in Speech Signal Processing", edited by Furui & Sondhi, published by MARCEL DEKKAR Co., Ltd. (New York), pages 109–140, 1991. An audio encoding method using the time-base to frequency-base conversion based on the MDCT encoding method will now be described hereinbelow.

FIG. 1 shows an example of a construction of an encoder using the MDCT encoding method. Encoding processes in the encoder will be described hereinbelow.

A digital audio signal, inputted through an input terminal 51, is converted from a signal in a time domain to a signal in a frequency domain at every certain time interval by an MDCT circuit 41. A data length corresponding to the time interval is called a conversion block length.

Audio data in the frequency domain outputted from the MDCT circuit 41 is quantized (variable length encoded) by a quantizing circuit 42. After that, header information such as sampling frequency or the like is added to the quantized audio data by a multiplexing circuit 43, and the resultant data is outputted as encoded data from an output terminal 52.

A time-base to frequency-base converting process which is executed in the MDCT circuit 41 is described by the following equation (1).

$$y(m) = \sum_{k=0}^{N-1} w(k)x(k)\cos[\pi(2k+1+n)(2m+1)/(2N)] \quad (1)$$

where, x(k): input signal
w(k): window function
y(m): signal subjected to the MDCT
N: conversion block length (samples)
n=N/2: phase term The window function w(k) is used to prevent the generation of a discontinuous signal at a boundary portion of two adjacent conversion blocks. An example of a shape of such a signal is shown in FIG. 2. In the equation (1), since the number of input signals x(k) to the MDCT circuit 41 equals N, and m is set to a value within a range from 0 to (N/2−1), the number of signals y(m) which were subjected to the MDCT becomes equal to N/2.

In the MDCT process, when the next block is converted after the present block was converted, the conversion is executed at a point deviated by a distance of N/2 samples from the present block to the next block. Namely, the MDCT is continuously executed to each conversion block in such a form that adjacent two blocks overlap by a distance of N/2 samples. This is intended to prevent the occurrence of a discontinuous signal at a boundary portion of conversion blocks. Such a situation is shown in FIG. 3. FIG. 3 shows an example when the value of conversion block length N is equal to 512 samples.

In the example of FIG. 3, the audio data has been divided into sub-blocks including 256 samples for explanation. First, a window function is applied to cover a sub-block 0 and a sub-block 1 and the MDCT is executed. Subsequently, the window is deviated by a distance of 256 samples, the window function is applied to cover the sub-block 1 and a sub-block 2, and the MDCT is executed. In the example of FIG. 3 as mentioned above, the MDCT of each block including 512 samples is continuously performed by overlapping 256 samples.

When the conversion block length in the MDCT circuit 41 is constant, the above-mentioned process is executed. However, a method of improving encoding efficiency by changing the conversion block length in accordance with signal characteristics of the input signal is also known. An example of such an MDCT encoding method of the variable block length, is the MPEG audio layer III in the International Standard Organization ISO IEC 11172-3. can be mentioned.

According to such an MDCT method of variable block length, the conversion block length is changed with the lapse of time in accordance with the characteristics of the input signal. Namely, when the characteristics of the input signal are stationary, the encoding process is executed by using a long conversion block length. On the other hand, in the case where the characteristics of the input signal suddenly change when, for example, a pulse-like signal is inputted, the encoding process is performed by using a short conversion block length.

Although there are various methods of changing the conversion block length, a method is often used in which when the long conversion block length is equal to an integer N, the short conversion block length is set to N/L (L=2, 3, . . . ).

As to the encoder of FIG. 1, in a conversion block length deciding circuit 44, the conversion block length is decided in accordance with the characteristics of the input audio signal and the decided conversion block length information is supplied to the MDCT circuit 41 and multiplexing circuit 43. The MDCT circuit 41 executes the MDCT process while changing the conversion block length with the lapse of time in accordance with the conversion block length information that is inputted from the conversion block length deciding circuit 44.

When the conversion block length information decided by the conversion block length deciding circuit 44 is sent to the multiplexing circuit 43, the conversion block length information and the quantization data are multiplexed by the multiplexing circuit 43 and the resultant data is outputted as encoded data from the output terminal 52.

As a digital audio signal which is inputted from the input terminal 51, audio signals of a plurality of channels can be treated. For example, when the user inputs audio signals of five channels which are used in a movie, the processes in the MDCT circuit 41, quantizing circuit 42, and conversion block length deciding circuit 44, are respectively independently executed for the five channels. After the data of five channels is multiplexed by the multiplexing circuit 43, the resultant data is outputted as encoded data.

In this case, by performing the encoding process by using a correlation among the channels, a sound quality at the same bit rate can be improved. As such, a processing method, a differential method, and a coupling method are known. The differential method is mainly used for sub-band information (data in each conversion block) of a low frequency band, and by obtaining the sum and the difference between the sub-band information of two channels, the information is concentratedly arranged to one channel upon encoding, thereby enabling an information amount to be reduced.

On the other hand, the coupling method is mainly used for sub-band information of a high frequency band, and by sharing a value of a real sample among a plurality of channels, an information amount can be reduced. In the high frequency band, power or sound pressure is relatively small and even if one sub-band information is shared among a plurality of channels, no problem occurs with the sense of hearing. Therefore, if there is a similar portion in the sub-band information of the high frequency band in each channel, by sharing the information of such a similar portion, the information amount is reduced.

FIG. 4 shows an example of an audio decoder according to the conventional MDCT method.

A conventional decoding technique for decoding audio data of a plurality of channels will now be described hereinbelow with reference to FIG. 4.

In FIG. 4, encoded audio data is inputted to a demultiplexing circuit 31 through an input terminal 21. In the demultiplexing circuit 31, the input encoded data is separated into multiplexed audio data of a plurality of channels and conversion block length information.

The audio data of each channel outputted by the demultiplexing circuit 31 is subjected to an inverse quantizing process for every channel by an inverse quantizing circuit 32. The processing result is inputted to an IMDCT (Inverse MDCT) circuit 33. The inverse quantizing process denotes that a bit length of each sample data which was variable length encoded is obtained and each sample data is identified. The conversion block length information separated by the demultiplexing circuit 31 is also inputted to the IMDCT circuit 33. The IMDCT circuit 33 executes an IMDCT process for every channel on the basis of the inputted conversion block length information.

A frequency base to time base converting process which is executed by the IMDCT circuit 33 is described by the following equation (2).

$$x(k) = \sum_{m=0}^{N/2-1} y(m)\cos[\pi(2k+1+n)(2m+1)/(2N)] \quad (2)$$

where, x(k): signal subjected to the IMDCT process
y(m): signal subjected to the MDCT process
N: conversion block length
n=N/2: phase term The number of signals x(k) subjected to the IMDCT process is equal to N and the number of signals y(m) subjected to the MDCT processed is equal to N/2.

After the signals which had been subjected to the IMDCT process on the basis of the equation (2) were temporarily stored into a delay buffer 34, a window applying arithmetic operation is performed by a window applying operating circuit 35. The window applying operating circuit 35 applies a window function (an example is shown in FIG. 2) of the same shape as that upon MDCT process, further adds data in overlap portions between the former half portion of the present block and the latter half portion of the previous block to reconstruct an audio signal. This is because the data has been converted by overlapping every N/2 sample, when the MDCT process is executed and therefore, an aliasing occurs unless the addition is performed.

FIG. 5 shows a state of the overlap at that time. In the example, first, the portions where 256 samples overlap between block 0 and block 1 each having 512 samples are added and the audio signal of 256 samples is reconstructed. Subsequently, the portions where 256 samples overlap between the block 1 and block 2 are added and the audio signal of next 256 samples is reconstructed. In a manner similar to the above, the audio signal is reconstructed for 256 samples.

When the audio data of a plurality of channels has been encoded and a speaker for generating an audio sound on the decoding side has only the channels of the number smaller than the number of encoded channels, there is a case where a down mixing process is executed. The down mixing process is a process for producing audio data of the channels of a smaller number from the audio data of a plurality of channels. An example of such a process is described as the following equation (3).

$$y(n) = \sum_{ch=0}^{M-1} \alpha[ch] \cdot x[ch][n] \quad (3)$$

where, x[ch][n]: input signal corresponding to the channel ch
y[n]: signal of one channel subjected to the down mixing
α[ch]: coefficient for the down mixing corresponding to the channel ch
M: the number of target channels to be subjected to the down mixing For example, although there is a case where the audio signal that is used in a movie or the like is constructed by encoding the audio data of five channels, in an audio apparatus for home use, audio signals of only two channels usually can be generated. In such a case, the down mixing process shown in the equation (3) is executed twice by a down mixing circuit 36, thereby producing the audio signals of two channels from the audio signals of five channels.

When the encoded audio data of all channels can be generated on the decoding side, there is no need to perform the down mixing process. In such a case, no process is executed in the down mixing circuit 36 and the audio data which was windowed by the window applying operating circuit 35 is outputted as it is from an output terminal 22.

FIG. 6 is a hardware constructional diagram showing further in detail the conventional audio decoder shown in FIG. 4 with consideration of a memory capacity.

FIG. 6 shows an example in which audio data of five channels is treated. A memory capacity when the conversion block length is set to 512 points is also shown. It is now assumed that the five channels are a left channel Lch, a center channel Cch, a right channel Rch, a rear left channel LSch, and a rear right channel RSch.

In FIG. 6, the audio data of each channel which was inversely quantized through the processes in the demultiplexing circuit 31 and inverse quantizing circuit 32 is stored into an inverse quantizing buffer 37. An arithmetic operation of the equation (2) is executed every channel by the IMDCT circuit (frequency base to time base converting circuit) 33 for the inversely quantized data of each channel stored in the inverse quantizing buffer 37. The arithmetic operation result is stored into a time base information buffer 38.

The audio data of each channel stored in the time base information buffer 38 is supplied to the window applying operating circuit (adding and window applying circuit) 35.

After the window applying arithmetic operation was executed in the window applying operating circuit 35, the data of the former half portion of the present block and the data of the latter half portion of the previous block stored in the delay buffer 34 are added so as to overlap.

The resultant data of the overlap addition from the window applying operating circuit 35 is stored into a PCM buffer 39. The data of the latter half portion of the present block is stored into the delay buffer 34 after completion of the window applying operation and is used for the overlap addition to the next block.

When the down mixing process is necessary, the audio data of each channel is read out from the PCM buffer 39 and the down mixing process shown in the equation (3) is executed by the down mixing circuit 36. The resultant data of the down mixing process is outputted through the output terminal 22.

As shown in FIG. 6, in the conventional audio decoder, it is necessary to provide the buffer memories such as inverse quantizing buffer 37, time base information buffer 38, delay buffer 34, and PCM buffer 39. A memory capacity of at least (256×5) words is necessary for each of the inverse quantizing buffer 37, time base information buffer 38, and delay buffer 34. A memory capacity of at least (256×10) words is necessary for the PCM buffer 39.

The reason why the memory capacity of (256×10) words is necessary for the PCM buffer 39 is as follows. Generally, in an audio equipment, it is required to output PCM data at a constant rate. To satisfy such a requirement, it is necessary to use double buffers one of which is for storing the data just after completion of the arithmetic operation by the window applying operating circuit 35 and the other of which is for outputting the data at a constant rate and it is necessary to perform pipeline operation of the double buffers. For this purpose, the memory capacity of (256×5×2) words is needed for the PCM buffer 39.

Namely, in the conventional audio decoder, the memory capacity of a total of 6400 words is necessary for the buffer memories of the inverse quantizing buffer 37, time base information buffer 38, delay buffer 34, and PCM buffer 39, and therefore, there is a problem such that a fairly large memory capacity is necessary.

SUMMARY OF THE INVENTION

The present invention is made to solve the above problem, and it is an object of the invention to reduce a memory capacity almost without deteriorating sound quality in an audio decoder. Namely, an object of the invention is to provide an inexpensive audio decoder which can perform a down mixing by reducing a memory capacity necessary to execute a series of decoding processes.

An audio decoder according to the present invention decodes encoded data including frequency domain audio data in which audio signals of a plurality of channels are expressed by frequency domains through a time base to frequency-base conversion.

To accomplish the above object, an audio decoder according to the first aspect of the invention includes: frequency domain down mixing means for processing the frequency domain audio data to mix the audio signals of the plurality of channels into the audio signals of a predetermined number of channels at a predetermined level ratio; and frequency base to time base converting means for converting the frequency domain audio data processed by the frequency domain down mixing means from the frequency domain to the time domain.

According to the first aspect of the invention, the down mixing process which is generally executed in the time domain at the last of a series of decoding processes is performed in the frequency domain before the frequency base to time base converting process, and the number of channels of the data to be treated by the frequency base to time base converting process decreases by the down mixing process. Therefore, as a memory capacity necessary for the frequency base to time base converting process, it is sufficient to use a memory capacity which is smaller by only the amount of reduced channel number.

In an audio decoder according to the second aspect of the invention, the frequency domain audio data includes sample data each of which has a variable bit length and indicates a sample about one of the audio signals of the plurality of channels, and the audio decoder includes: inverse quantizing means for obtaining a bit length of each sample data from the frequency domain audio data and identifying the sample data; frequency base to time base converting means for converting the sample data identified by the inverse quantizing means from the frequency domain to the time domain; and a memory which is used in the inverse quantizing process in the inverse quantizing means and the frequency base to time base converting process in the frequency base to time base converting means, wherein with respect to each of the audio signals of the plurality of channels, the inverse quantizing process in the inverse quantizing means and the frequency base to time base converting process in the frequency base to time base converting means are executed by pipeline processes.

According to the second aspect of the invention, the memory is shared when the pipeline processes are executed by the inverse quantizing means and the frequency base to time base converting means and there is no need to separately provide a memory for storing the data which was inversely quantized and a memory for storing the data which was frequency base to time base converted. Moreover, by executing the pipeline processes with regard to each of the audio signals of a plurality of channels, the same domain in the memory can be repetitively used many times, so that it is sufficient to provide memory domains of the number smaller than the number of channels of the audio signals.

An audio decoder according to the third aspect of the invention includes: frequency base to time base converting means for converting the frequency domain audio data from the frequency domain into the time domain by using a cosine function with respect to each of the audio signals of the plurality of channels, thereby forming time domain audio data; window applying means for obtaining another value from one value of a set of time domain audio data values having a symmetry which is derived from the cosine function and for performing a window applying arithmetic operation; and a buffer memory for delaying the time domain audio data which is used when the window applying arithmetic operation is executed by the window applying means and which stores one of the set of time domain audio data values having the symmetry.

According to the third aspect of the invention, since the window applying arithmetic operation is executed after the other value was obtained from one value of the set of time domain audio data values having the symmetry, it is sufficient to store only one value of the set of time domain audio data values into the buffer memory to delay the time domain audio data that is used when the window applying arithmetic operation is executed.

An audio decoder according to the fourth aspect of the invention includes: frequency base to time base converting means for converting the frequency domain audio data from the frequency domain into the time domain with respect to each of the audio signals of the plurality of channels, thereby forming time domain audio data; window applying means for performing a window applying arithmetic operation for the time domain audio data; down mixing means for processing the time domain audio data outputted from the window applying means so as to mix the audio signals of the plurality of channels into the audio signals of a predetermined number of channels at a predetermined level ratio; and a buffer memory for temporarily storing and outputting the time domain audio data outputted from the down mixing means.

According to the fourth aspect of the invention, after the number of channels of the audio signals was reduced by the mixing process, the time domain audio data is stored into the buffer memory for outputting the data. Therefore, a capacity of the buffer memory can be reduced as compared with the conventional one in which the audio data of a large number of channels just after completion of the window applying arithmetic operation is stored into the buffer memory.

An audio decoder according to the fifth aspect of the invention includes: frequency base to time base converting means for converting the frequency domain audio data from the frequency domain to the time domain with respect to each of the audio signals of the plurality of channels, thereby forming time domain audio data; window applying means for performing a window applying arithmetic operation for the time domain audio data; a buffer memory for delaying data which is used when the window applying means executes the window applying arithmetic operation; and down mixing means for processing the time domain audio data outputted from the window applying means so as to mix the audio signals of the plurality of channels into the signals of a predetermined number of channels at a predetermined level ratio and for storing the processed time domain audio data into the buffer memory.

According to the fifth aspect of the invention, after the number of channels of the audio signals was reduced by the mixing process, the time domain audio data is stored into the buffer memory for delaying the data, so that a capacity of the buffer memory can be reduced as compared with the conventional one in which the audio data of a large number of channels just after the frequency base to time base conversion was performed is stored into the buffer memory.

DETAILED DESCRIPTION OF THE PREFERRED EMBODIMENTS

Embodiments of an audio decoder according to the present invention will now be described hereinbelow with reference to the drawings.

Figure 7:
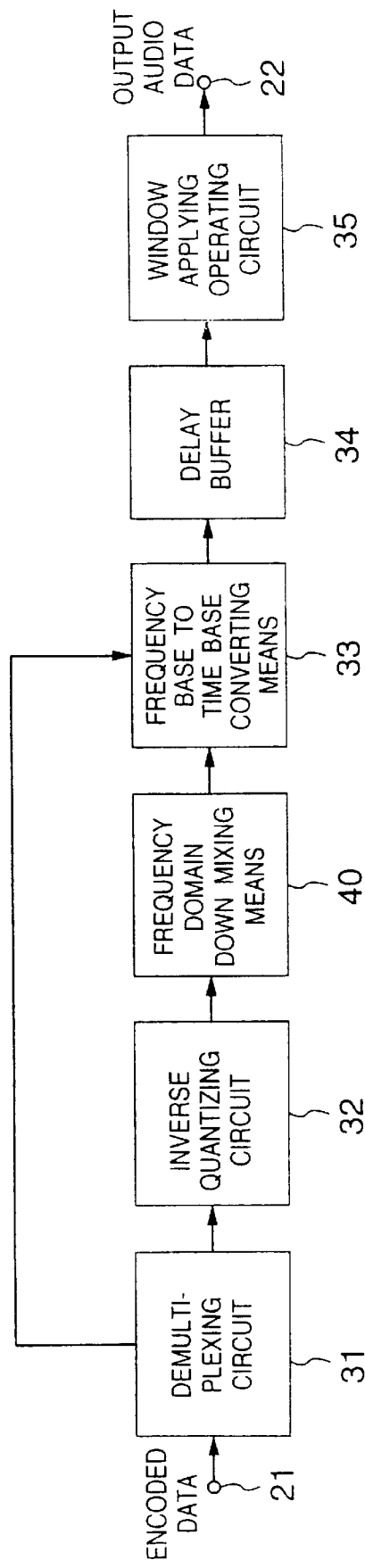
FIG. 7 is a diagram showing a specific constructional example of an audio decoder according to the first embodiment of the invention.

FIG. 7 shows a constructional example of the audio decoder according to the first embodiment.

In FIG. 7, encoded data inputted through the input terminal 21 is separated into audio data of a plurality of channels and conversion block length information by the demultiplexing circuit 31. Since the audio data expresses audio signals of the plurality of channels in a frequency domain, it is called frequency domain audio data.

The frequency domain audio data of the plurality of channels separated by the demultiplexing circuit 31 is subjected to an inverse quantizing process for every channel by the inverse quantizing circuit 32 and is inputted to frequency domain down mixing means 40. The conversion block length information separated by the demultiplexing circuit 31 is inputted to the frequency base to time base converting means 33.

The audio data (time domain audio data) indicative of the audio signals of the plurality of channels in the time domain outputted from the frequency base to time base converting means 33 is delayed by the delay buffer 34. After that, the delayed audio data is inputted to the window applying operating circuit 35 and is subjected to the window applying arithmetic operation.

Figure 8:
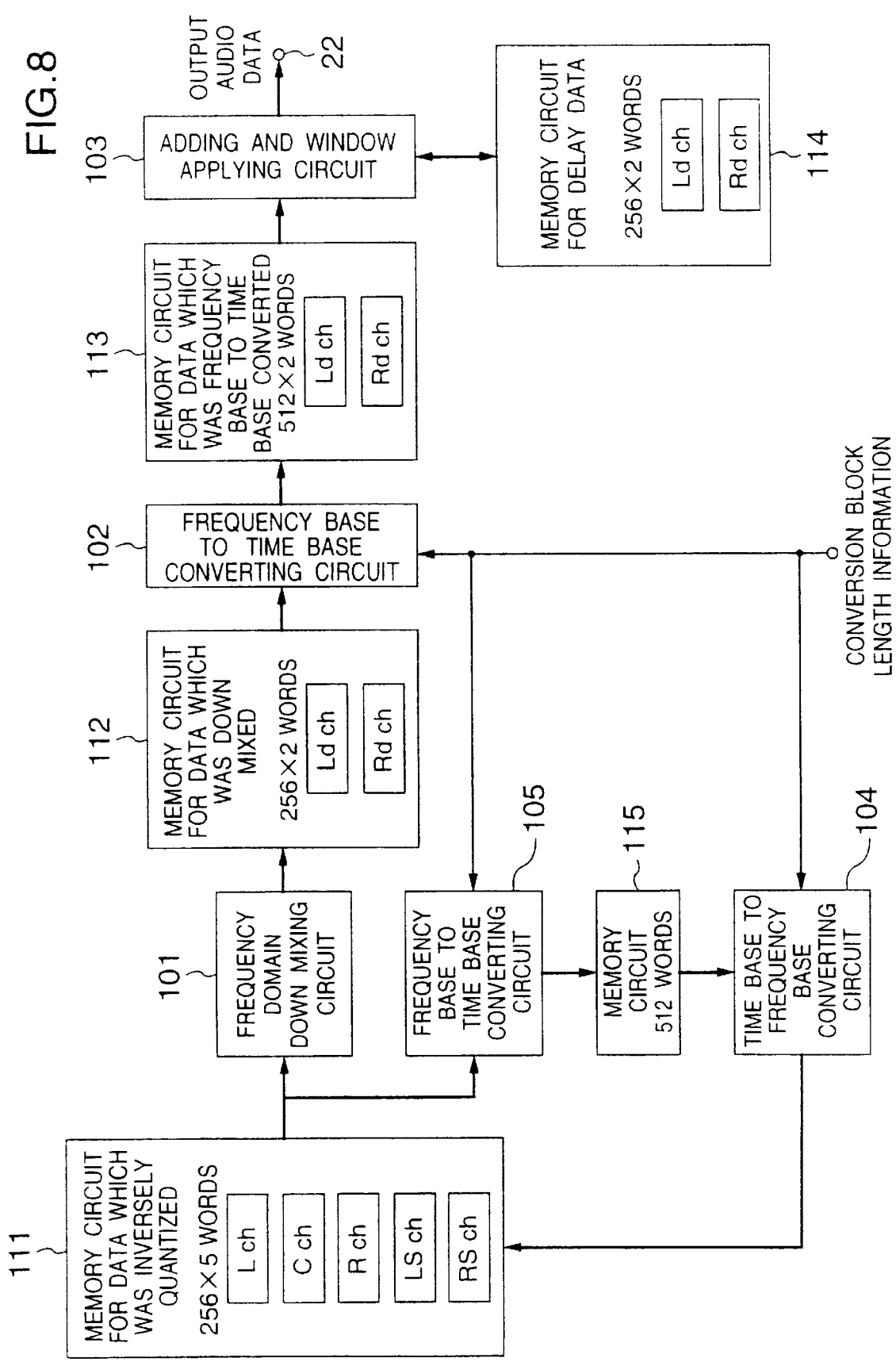
FIG. 8 is a diagram showing a specific constructional example of a down mixing means and a frequency base to time base converting means as shown in FIG. 7.

FIG. 8 shows further in detail the portions corresponding to the frequency domain down mixing means 40 and frequency base to time base converting means 33 of the audio decoder of the embodiment shown in FIG. 7 with consideration of a memory capacity.

Processes which are executed in the frequency domain down mixing means 40 and frequency base to time base converting means 33 will now be described hereinbelow with reference to FIG. 8.

Figure 6:
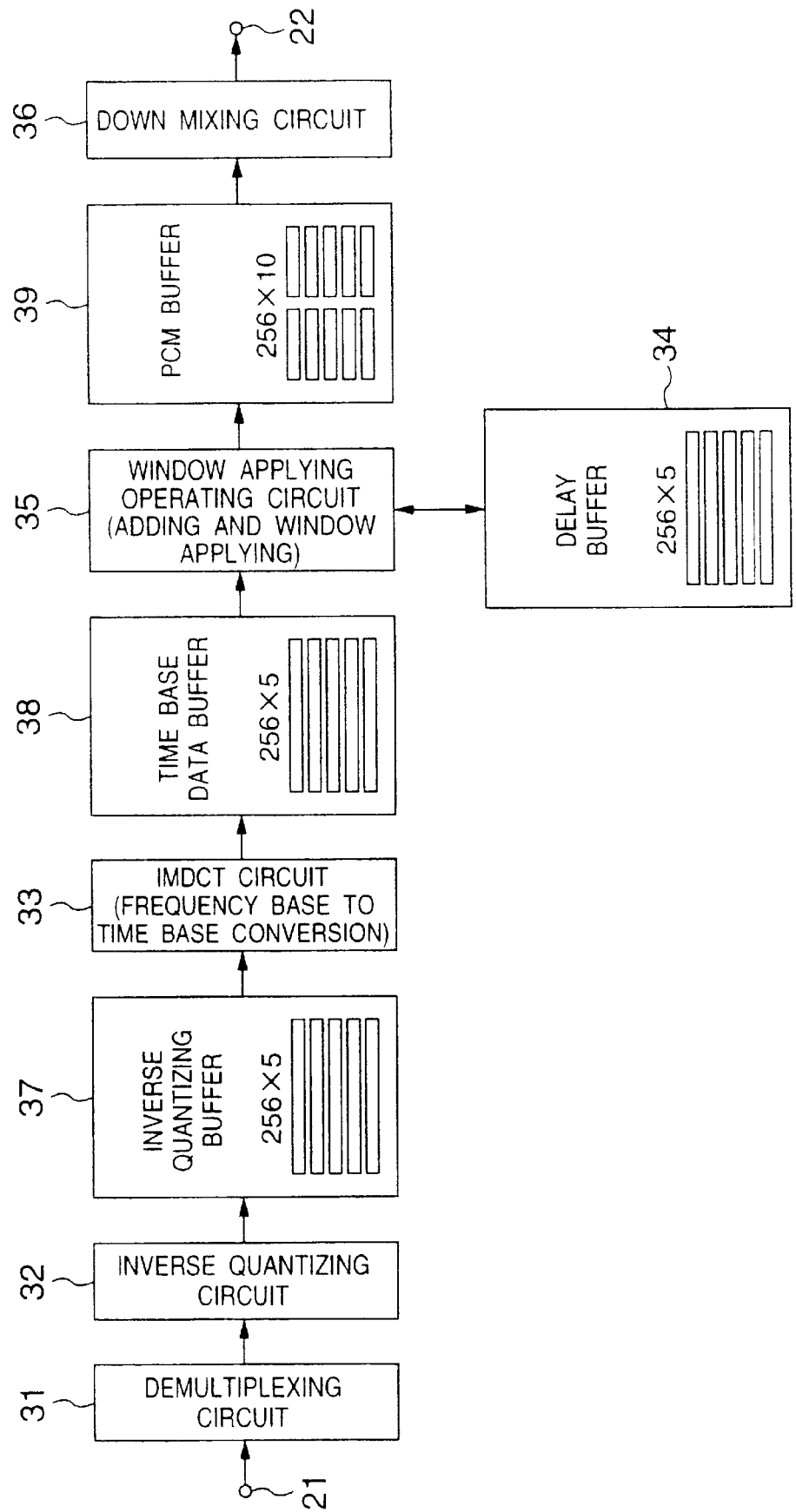
FIG. 6 is a diagram showing a constructional example of a hardware of the conventional audio decoder shown in FIG. 4.

In a manner similar to FIG. 6, FIG. 8 also shows an example in which audio data of five channels are treated and a memory capacity when assuming that the conversion block length is set to 512 points is described. In FIG. 8, Lch, Cch, Rch, LSch, RSch, Ldch, and Rdch denote data regions for the left channel, center channel, right channel, rear left channel, rear right channel, left channel after completion of the down mixing process, and right channel after completion of the down mixing process, respectively.

The data which was inversely quantized by the inverse quantizing circuit 32 in FIG. 7 is stored into a first memory circuit 111 in FIG. 8. Subsequently, the down mixing process is executed by a frequency domain down mixing circuit 101 for the frequency domain audio data stored in the first memory circuit 111. The resultant data of the down mixing process is stored into a second memory circuit 112. The process to be executed in the frequency domain down mixing circuit 101 is described by the following equation (4).

$$Y(n) = \sum_{ch=0}^{M-1} \alpha[ch]X[ch][n] \quad (4)$$

where,

X[ch][n]: input signal in the frequency domain corresponding to the channel ch

Y[n]: down mixed signal in the frequency domain

α[ch]: coefficient for the down mixing corresponding to the channel ch and is the same as that shown in the equation (3)

M: the number of target channels to be down mixed

When the conversion block lengths are different between the channels as targets of the down mixing process, first, the data of the channel having a different conversion block length from that of the other channels is once converted into the data in the time domain by a frequency base to time base converting circuit 105 and stored into a fifth memory circuit 115. After that, the conversion into the frequency domain is again executed by a time base to frequency base converting circuit 104 to match the conversion block length. As mentioned above, when the down mixing process is executed in the frequency domain, the conversion block lengths of the channels are equalized. Thus, the down mixing process in the frequency domain can be efficiently performed.

For example, it is assumed to perform a encoding process using two kinds of conversion block lengths of N and N/2 samples. In this case, there is a possibility that five channels as targets of the down mixing process have two kinds of conversion block lengths of N and N/2 samples. In this instance, after the data of the conversion block length of N/2 samples was frequency base to time base converted by an amount corresponding to two such data by the frequency base to time base converting circuit 105, the data is time base to frequency base converted on the basis of the conversion block length of N samples by the time base to frequency base converting circuit 104, thereby matching the conversion block lengths of all channels to N samples.

A converting process to the time domain is subsequently performed for the frequency domain audio data stored in the second memory circuit 112 by a frequency base to time base converting circuit 102. The conversion result is stored into a third memory circuit 113. Finally, the following processes are executed by an adding and window applying circuit 103.

Namely, after the window applying process was performed to the data in the former half portion of the present block, the resultant data is overlap added to the data in the latter half portion of the previous block stored in a fourth memory circuit 114, so that audio data is reconstructed. The audio data reconstructed as mentioned above is outputted through the output terminal 22. After the window applying process was performed for the data in the latter half portion of the present block, the resultant data is stored into the fourth memory circuit 114.

As shown in FIG. 8, scales of the memory circuits 111 to 115 are set to memory capacities of (256×5) words for the first memory circuit 111, (256×2) words for each of the second and fourth memory circuits 112 and 114, (512×2) words for the third memory circuit 113, and 512 words for the fifth memory circuit 115, respectively. In this embodiment, since it is sufficient to use the memory of the capacity as large as a total of 3840 words, it will be understood that in the embodiment, the memory capacity is reduced by 2560 words as compared with the conventional one shown in FIG. 6. Therefore, according to the embodiment, the audio decoder which can perform the down mixing process can be inexpensively constructed.

In the processes which are executed by the frequency domain down mixing means and frequency base to time base converting means shown in FIG. 8, the difference among the conversion block lengths among the channels is corrected by performing the frequency base to time base conversion and the time base to frequency base conversion.

In the encoding method using the time base to frequency base conversion having the variable block length, the long conversion block length in which a high frequency resolution and a high encoding efficiency is selected in most of the blocks. The short conversion block length is selected in only a few blocks. Therefore, at the time of the down mixing process, a difference among the conversion block lengths hardly occurs.

With respect to a decoding processing amount, although a processing amount locally increases in the block in which the difference of the conversion block lengths occurs between the channels, the processing amount contrarily decreases in most of the other blocks. Therefore, the whole processing amount can be reduced by about 20% than the conventional one.

In order to construct a further inexpensive audio decoder, the frequency base to time base converting circuit 105, fifth memory circuit 115, and time base to frequency base converting circuit 104 in FIG. 8 may be omitted and when the conversion block lengths among the channels do not coincide, it is sufficient to execute a process of eliminating one or more channel having a different conversion block length from the targets of the down mixing process. Even in this case, the audio decoder capable of the down mixing can be inexpensively constructed but enough sound quality can be obtained in spite of such an inexpensive construction. A circuit scale and a decoding processing amount can be further reduced.

Although the above embodiment has been described as an example with respect to the MDCT as a time base to frequency base conversion, the above discussion can be also easily applied to a case of using a time base to frequency base conversion of another byte.

According to the embodiment, as described above, in the audio decoder for decoding the audio data of the plurality of channels which was encoded in the frequency domain by using the time base to frequency base conversion, after the down mixing process was performed in the frequency domain, the frequency base to time base converting process is executed. Therefore, the number of channels of the data to be treated in the frequency base to time base converting process after the down mixing process can be reduced by the down mixing process. The number of memory circuits which are necessary to temporarily store the data in the frequency base to time base converting process can be reduced. Since it is sufficient to use the small number of channels of the data to be treated in the frequency base to time base converting process, the whole decoding processing amount can be also reduced. Thus, the inexpensive audio decoder capable of the down mixing can be realized without remarkably deteriorating the sound quality.

According to another feature of the embodiment, when the frequency domain down mixing means executes the down mixing process for the audio data of a plurality of channels in the frequency domain and the conversion block lengths of the time base to frequency base converting process are different among the channels as targets, the conversion block lengths of all channels are matched and, after that, the down mixing process is executed. Therefore, the down mixing process in the frequency domain can be efficiently executed.

According to still another feature of the embodiment, when the conversion block lengths do not coincide among the channels, the channel having a different conversion block length is eliminated from the targets of the down mixing process. Therefore, the construction of the apparatus can be simplified. A satisfactory sound quality can be obtained in spite of such construction of the inexpensive audio decoder. The circuit scale and the decoding processing amount can be further reduced without largely deteriorating the sound quality.

The second embodiment of an audio decoder according to the invention will now be described in detail with reference to the drawings.

Figure 9:
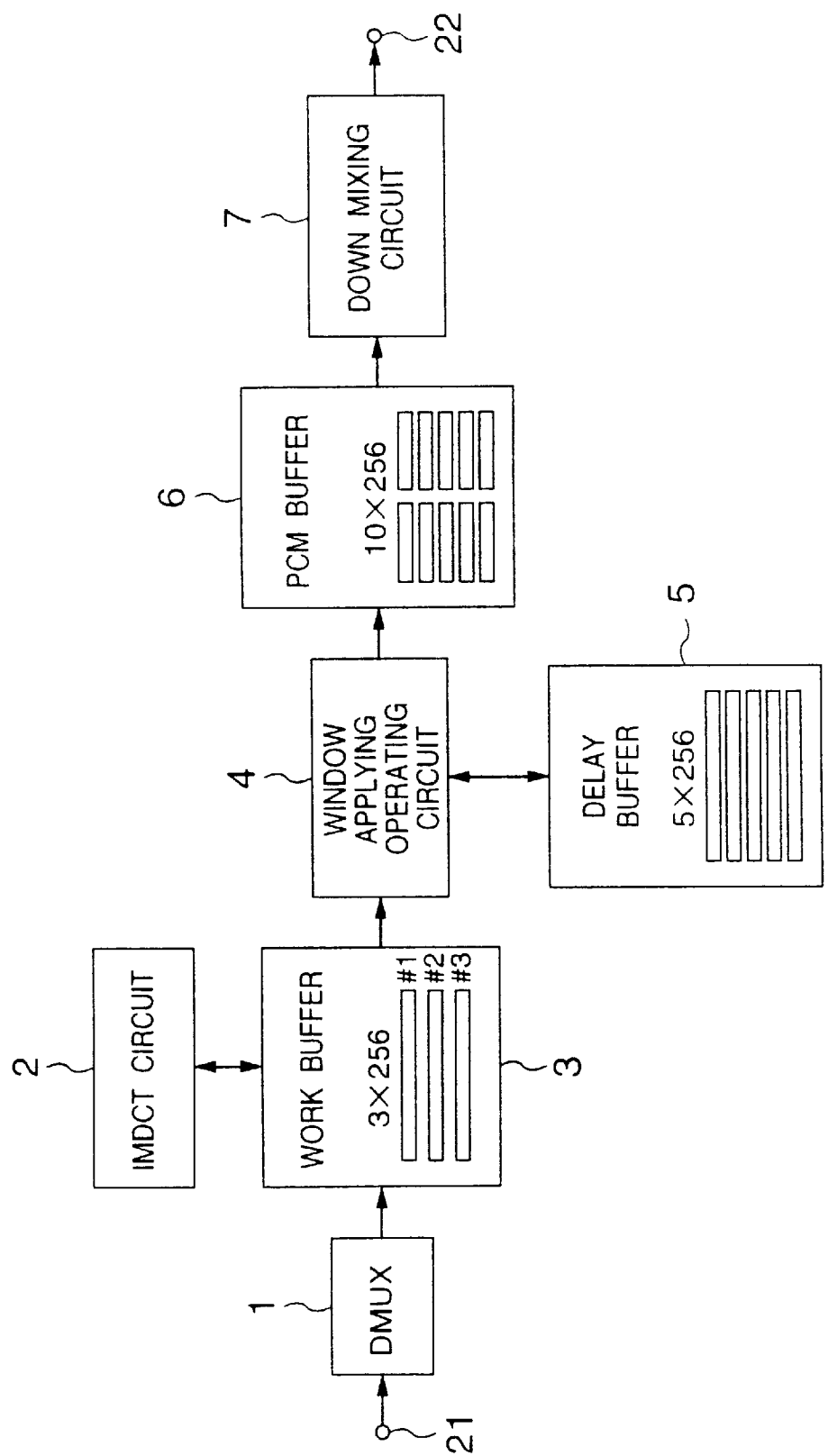
FIG. 9 is a diagram showing a constructional example of a hardware of an audio decoder according to the second embodiment of the invention.

FIG. 9 is a diagram showing a constructional example of a hardware of the audio decoder according to the second embodiment which will be explained in comparison with the construction shown in FIG. 6 as a prior art.

Although the demultiplexing circuit 31 and inverse quantizing circuit 32 are separately shown in FIG. 6, they are combined into one component and shown as DMUX 1 in FIG. 9. Namely, the DMUX 1 in the embodiment 2 simultaneously executes a separating process of the multiplexed data and an inverse quantizing process of the separated audio data of each channel. In a manner similar to FIG. 6, FIG. 9 also shows an example in which the audio data of five channels are treated and shows a memory capacity when it is assumed that the conversion block length is set to 512 points.

In the audio decoder according to the second embodiment shown in FIG. 9, the capacity of the buffer memory can be reduced by making the DMUX 1 and an IMDCT circuit 2 cooperative.

Namely, in the prior art of FIG. 6, the two buffer memories each having a memory capacity of (256×5) words have been provided before and after the IMDCT circuit 33, while in the second embodiment, the pipeline processes are executed in the DMUX 1 and IMDCT 2 and a work buffer 3 is shared, so that it is sufficient to reduce a memory capacity of the work buffer 3 into (256×3) words. The pipeline processes denote that the same memory is commonly used in a plurality of processes.

Figure 10:
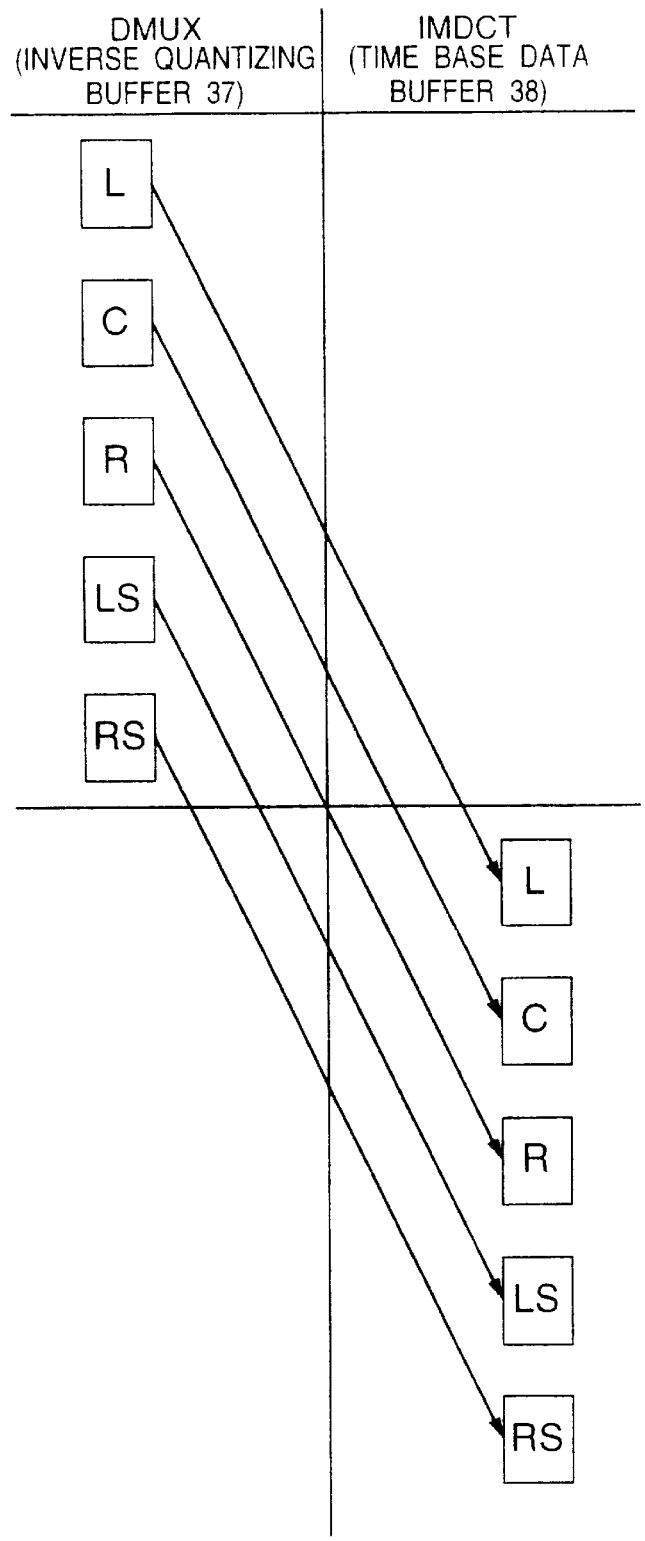
FIG. 10 is a diagram for explaining the operation of the conventional audio decoder.

The above point will now be described in detail hereinbelow with reference to FIGS. 10 and 11. That is, in the prior art shown in FIG. 6, as shown in FIG. 10, the inverse quantizing process is first executed with respect to five channels of the left channel Lch, center channel Cch, right channel Rch, rear left channel LSch, and rear right channel RSch, respectively. The inverse quantized data of each channel obtained by such a process is stored into the inverse quantizing buffer 37.

When the inverse quantized data of five channels is stored into the inverse quantizing buffer 37, the frequency base to time base converting process is executed for the inverse quantized data of five channels every channel by the IMDCT circuit 33. The audio data of the time domain obtained by such a process is stored into the time base information buffer 38 for every channel. Therefore, hitherto, total ten sets of buffer memories were needed.

Figure 11:
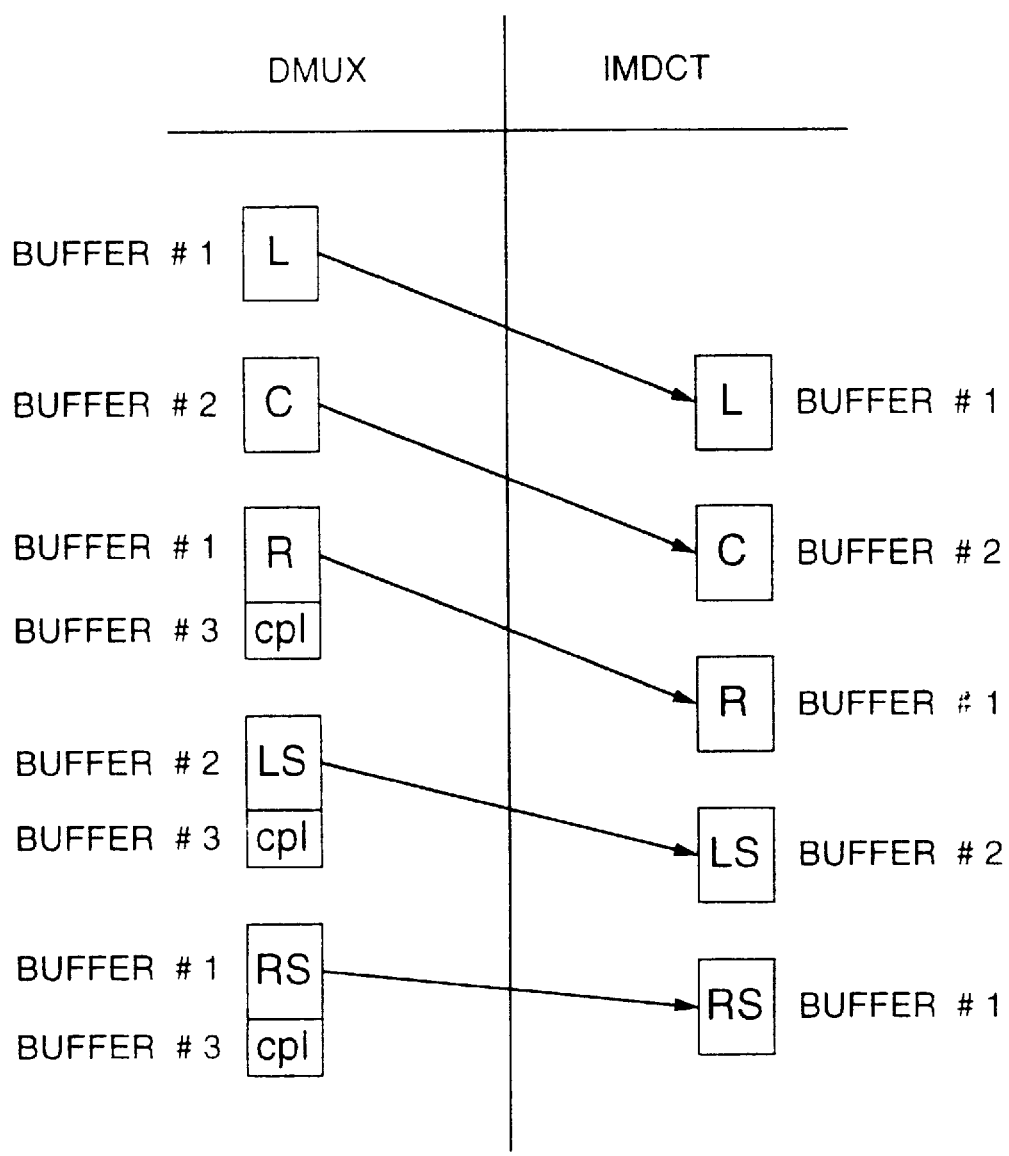
FIG. 11 is a diagram for explaining the operation of the audio decoder according to the second embodiment of the invention.

On the other hand, according to the embodiment, as shown in FIG. 11, the audio data of the left channel Lch is first inverse quantized by the DMUX 1 and is stored into a first buffer #1 in the work buffer 3. Thereafter, the inverse quantized data stored in the first buffer #1 is frequency base to time base converted by the IMDCT circuit 2. During such a period of time, the DMUX 1 executes the inverse quantizing process with respect to the next, center channel Cch and the inverse quantized data obtained by such a process is stored into a second buffer #2.

After completion of the frequency base to time base converting process for the inverse quantized data stored in the first buffer #1, the IMDCT circuit 2 executes the frequency base to time base converting process to the inverse quantized data stored in the next second buffer #2. For such a period of time, the DMUX 1 executes the inverse quantizing process with respect to the next right channel Rch and the inverse quantized data obtained by such a process is again stored into the first buffer #1.

By allowing the DMUX 1 and IMDCT circuit 2 to perform the pipeline operations, as to a work buffer 3 which is used in the pipeline processes, it is fundamentally sufficient to provide only the first buffer #1 and the second buffer #2.

In the embodiment, as shown in FIG. 9, in addition to the first buffer #1 and the second buffer #2, a third buffer #3 is provided in the work buffer 3. The third buffer #3 is used to store the data for coupling described in the prior art.

Namely, in the coupling system, since the information of similar portions in the audio data of the high frequency band in each channel is shared, the buffer memory to hold the data in the shared portion is separately needed. Although the memory capacity of the third buffer #3 has been set to 256 words here, it is sufficient to provide at least a maximum limit capacity to be shared (capacity that is determined in accordance with the encoding method: in the embodiment, it is set to 219 words).

As mentioned above, according to the embodiment, as buffer memories to be used for the separating process and inverse quantizing process of the multiplexed data in the DMUX 1 and for the frequency base to time base converting process in the IMDCT circuit 2, it is sufficient to use three sets of the first to third buffers #1 to #3 in the work buffer 3, so that the memory capacity is reduced to (256×3) words. Consequently, the whole memory capacity can be remarkably decreased as compared with that in the prior art (FIG. 6) where the memory capacity of (256×10) words was needed for the same processes.

Figure 12:
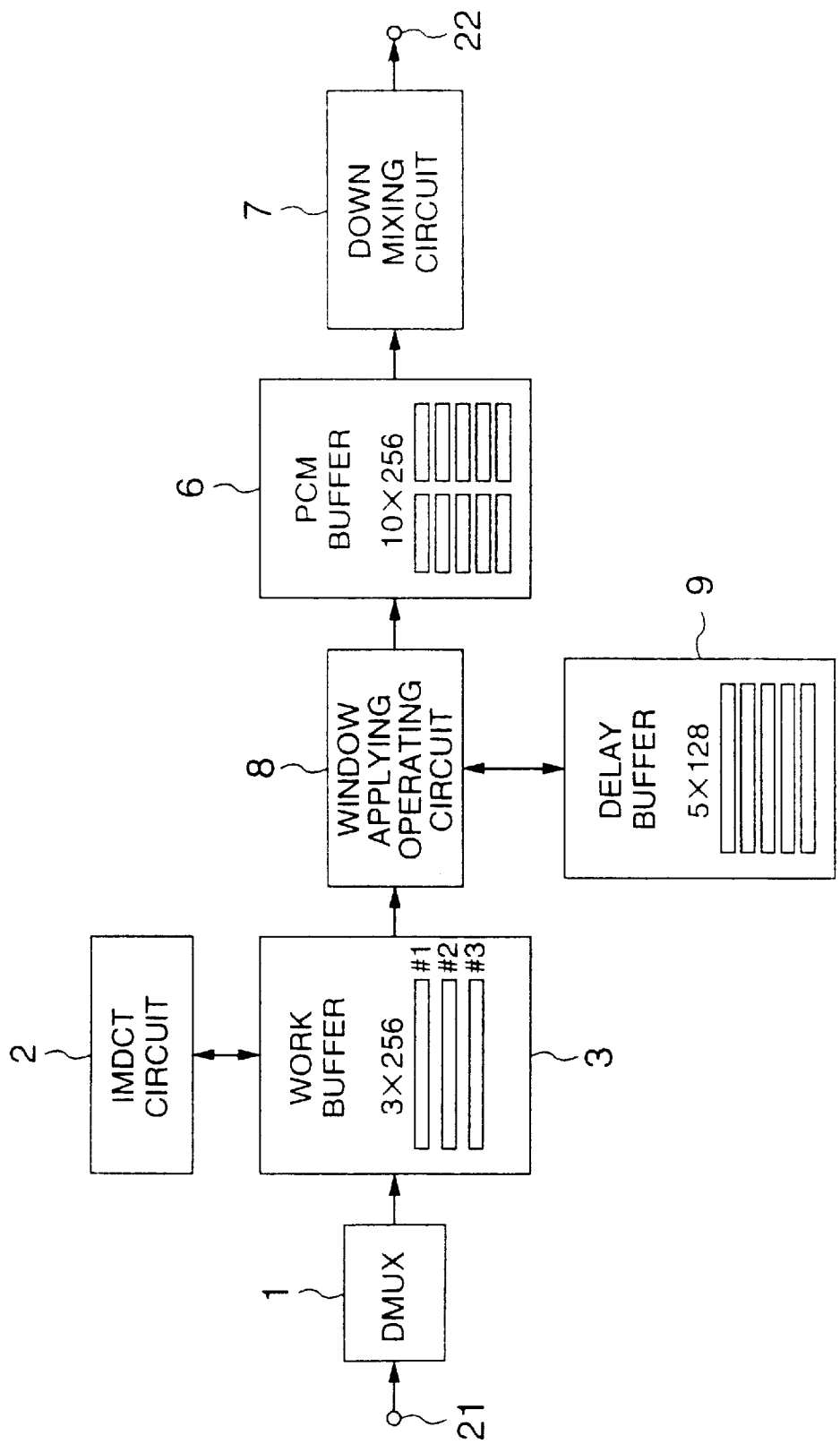
FIG. 12 is a diagram showing a constructional example of a hardware of an audio decoder according to the third embodiment of the invention.

The third embodiment of the invention will now be described. FIG. 12 is a diagram showing a constructional example of a hardware for an audio decoder according to the third embodiment and relates to a modification of the construction according to the second embodiment shown in FIG. 9.

According to the audio decoder shown in FIG. 12, a symmetry of a cosine function of the audio data which was frequency base to time base converted by the IMDCT circuit 2 is used and only the original values among the sample values at 256 points of the audio data converted into the time domain are stored into a delay buffer 9, thereby enabling the capacity of the buffer memory to be further reduced.

Figure 1:
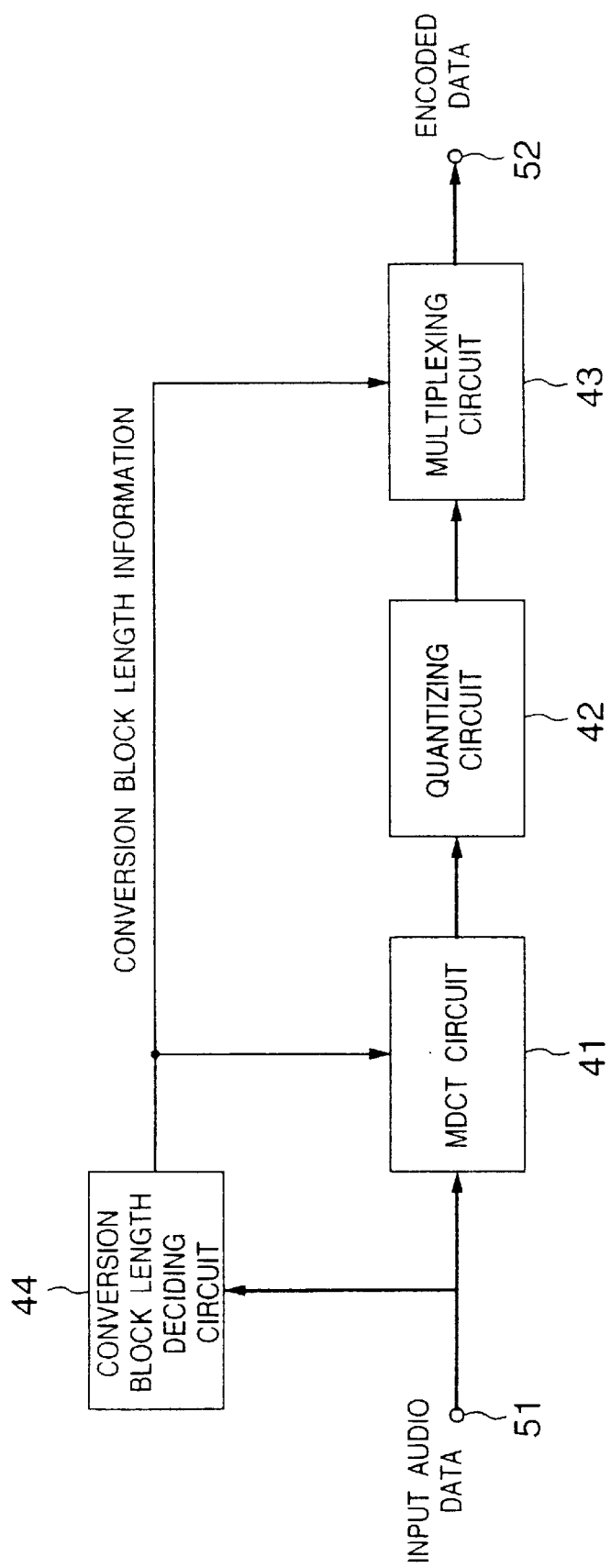
FIG. 1 is a diagram showing a constructional example of an audio encoder.
Figure 2:
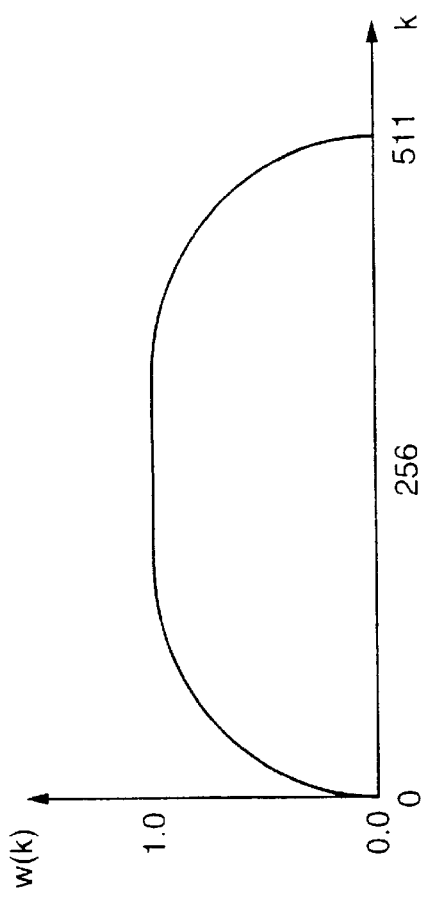
FIG. 2 is a diagram showing an example of a shape of a window function.
Figure 3:
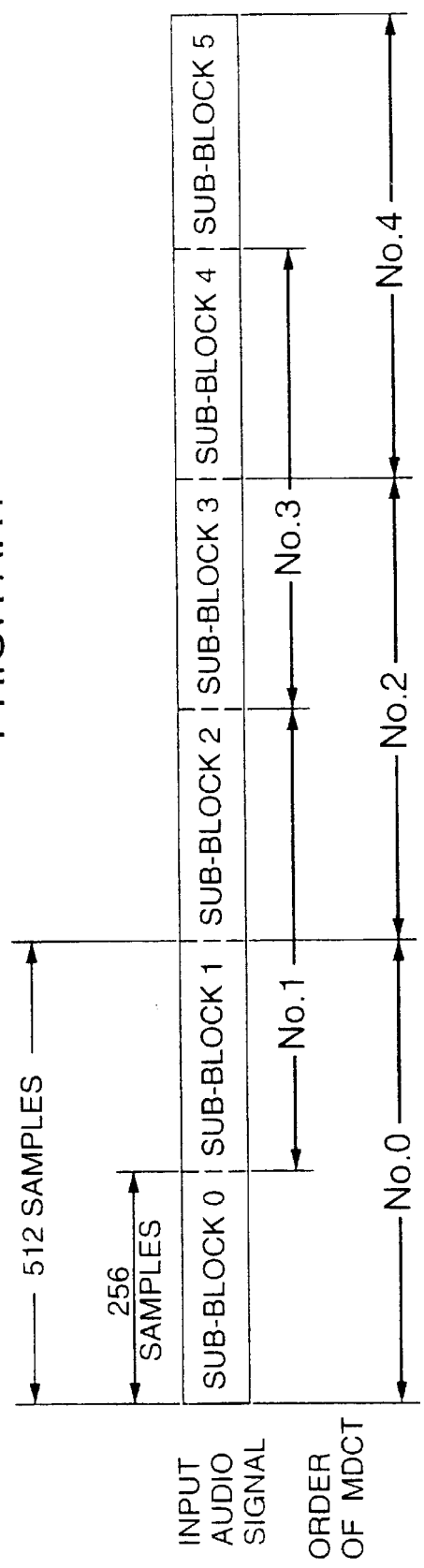
FIG. 3 is a diagram showing the order of an MDCT process.
Figure 4:
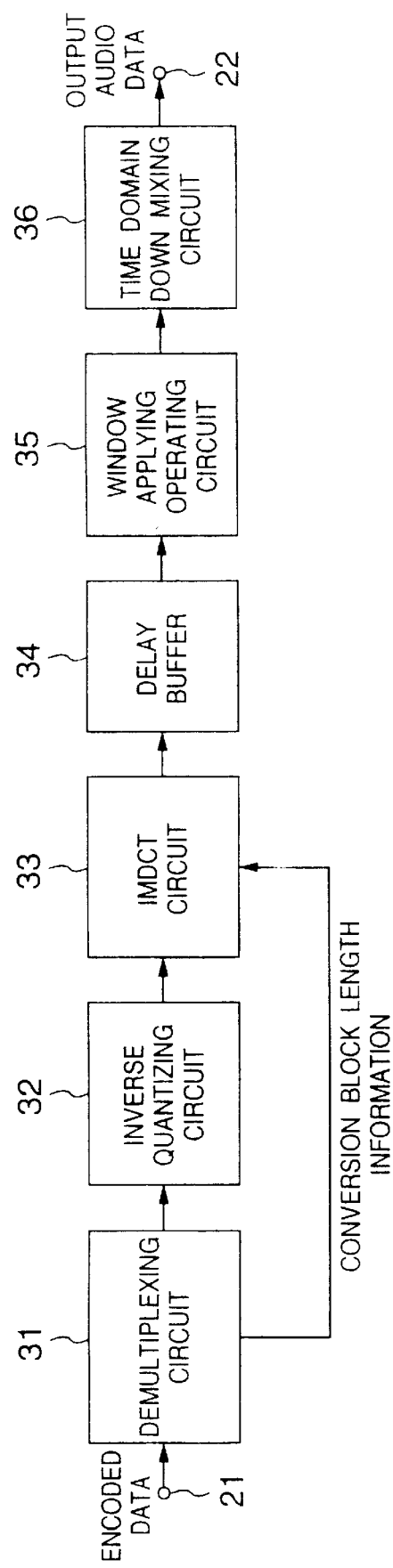
FIG. 4 is a diagram showing a constructional example of a conventional audio decoder.
Figure 13:
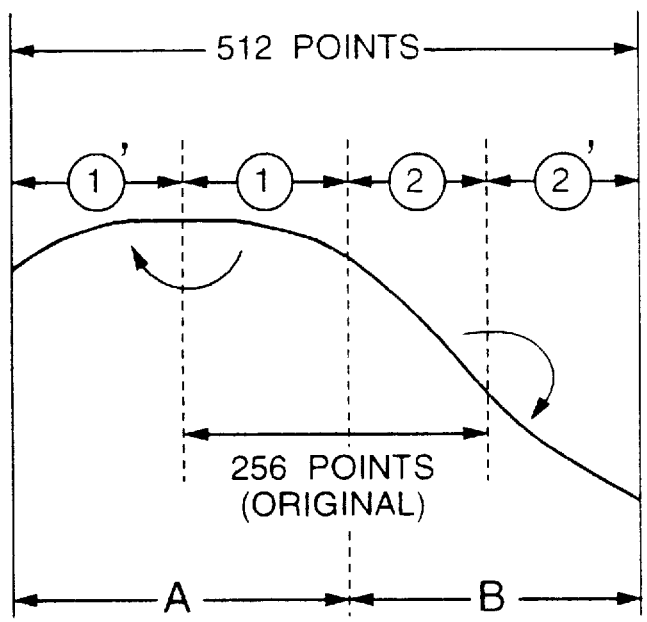
FIG. 13 is a diagram for explaining a feature of the audio decoder according to the third embodiment of the invention.

The above point will now be further described in detail hereinbelow with reference to FIGS. 13, 3, and 5. The conversion block length in the embodiment is equal to 512 points and the audio data of 512 points converted into the time domain is subsequently subjected to the window applying arithmetic operation. However, as shown in FIG. 3, at the time of encoding, the window applying process is executed by overlapping the sample values while shifting them by 256 points at a time. Namely, as for the sample values at 512 points, the sample values at 256 points are repetitively used twice.

In the third embodiment, therefore, by devising a method of repetitively using the sample values at 256 points, the memory capacity of the delay buffer 9 can be reduced. That is, as shown in FIG. 13, the original sample values at 256 points (portions of ① and ②) are arranged at the center of the conversion block length. Before the window applying arithmetic operation is executed, the sample values of the portions ①' and ②', which are symmetrical with the sample values of the portions ① and ②, are obtained by using the symmetry of the cosine function, thereby obtaining the sample values at 512 points.

Figure 5:
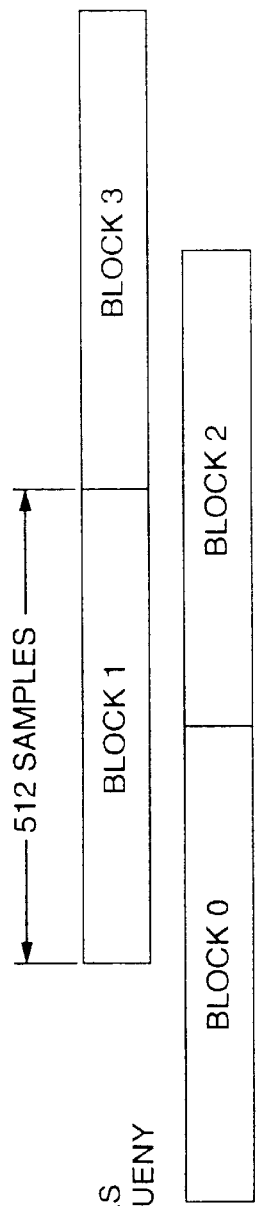
FIG. 5 is a diagram showing the overlap relation at the time of a decoding process.

In this case, as described by using FIG. 5, among the sample values at 512 points which are obtained as described above, the sample values at 256 points belonging to the former half portion A are used as they are for the overlap addition in a window applying operating circuit 8 in FIG. 12. On the other hand, the sample values at 256 points belonging to the latter half portion B are delayed by a predetermined time and are used for the overlap addition. Namely, only the sample values at 256 points belonging to the latter half portion B are subjected to the delay of a predetermined time.

Among the sample values at 256 points belonging to the latter half portion B, the sample values of ②' are obtained from the original sample values of ② by calculations. Therefore, if the sample values at 128 points of the portion of ② are stored into the delay buffer 9 and are delayed by only a predetermined time, the sample values at 512 points are reconstructed and the window applying arithmetic operation can be performed.

If the window applying operating circuit 8 shown in FIG. 12 is allowed to execute the window applying arithmetic operation after the sample values of the portions ①' and ②' having the symmetry were obtained from the sample values of the portions ① and ②, there will be no problem in the practical use.

As mentioned above, in the third embodiment, it is sufficient that the sample values at 128 points as original portions of the audio data which was frequency base to time base converted are stored into the delay buffer 9. Consequently, although a delay buffer 5 needs a memory capacity of (256×5) words in the second embodiment of FIG. 9, it is sufficient to use a memory capacity of (128×5) words in the third embodiment. Therefore, the whole memory capacity of the audio decoder can be further reduced.

Figure 14:
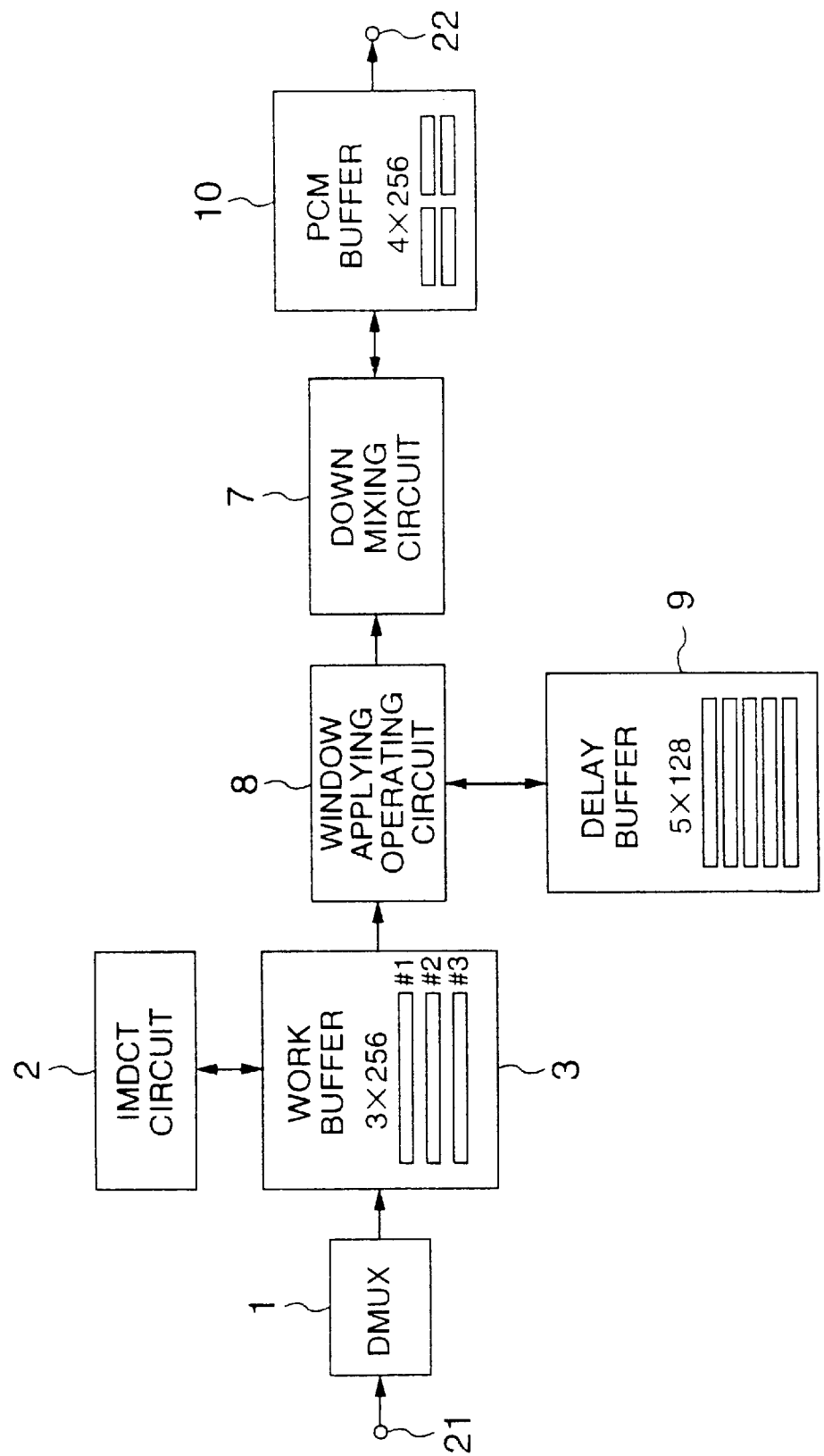
FIG. 14 is a diagram showing a constructional example of a hardware of an audio decoder according to the fourth embodiment of the invention.

The fourth embodiment of the invention will now be described. FIG. 14 is a diagram showing a constructional example of a hardware of the audio decoder according to the fourth embodiment and relates to a further modification of the construction of the third embodiment shown in FIG. 12.

According to the audio decoder shown in FIG. 14, PCM data of five channels produced by performing the window applying process by the window applying operating circuit 8 is immediately down mixed and only the resultant data after completion of the down mixing process is stored into a PCM buffer 10, thereby enabling a capacity of the buffer memory to be further reduced.

Namely, since the processes are executed in a pipeline manner in the DMUX 1 and IMDCT circuit 2 in FIG. 14, the PCM data of five channels is intermittently produced in the window applying operating circuit 8 for performing the window applying process by using the audio data obtained by the pipeline processes. In this case, in the above second and third embodiments, after the PCM data of five channels is stored as it is into a PCM buffer 6, the PCM data is down mixed into the PCM data of two channels by a down mixing circuit 7 and the resultant data is outputted.

On the other hand, in the fourth embodiment, the PCM data of five channels produced by the window applying operating circuit 8 is immediately down mixed to the data of two channels. The down mixed PCM data of only two channels is stored into the PCM buffer 10.

Thus, the PCM buffer 6 needs the memory capacity of (256×10) words in the second and third embodiments, while in the fourth embodiment, it is sufficient to use a memory capacity of (256×4) words for the PCM buffer 10 and the whole memory capacity of the audio decoder can be further reduced.

In FIG. 14, the reason why the down mixing circuit 7 and PCM buffer 10 are connected by double arrows is as follows. The down mixing process is not executed in a lump after all of the PCM data of five channels was derived but is executed so as to overwrite the PCM data of each channel little by little.

Therefore, processes such that the down mixing circuit 7 reads the data which was once stored into the PCM buffer 10 and adds the down mixed value to the read value and the resultant value is again stored into the same memory area in the PCM buffer 10, are necessary. The double arrows in FIG. 14 show such overwriting processes.

Figure 15:
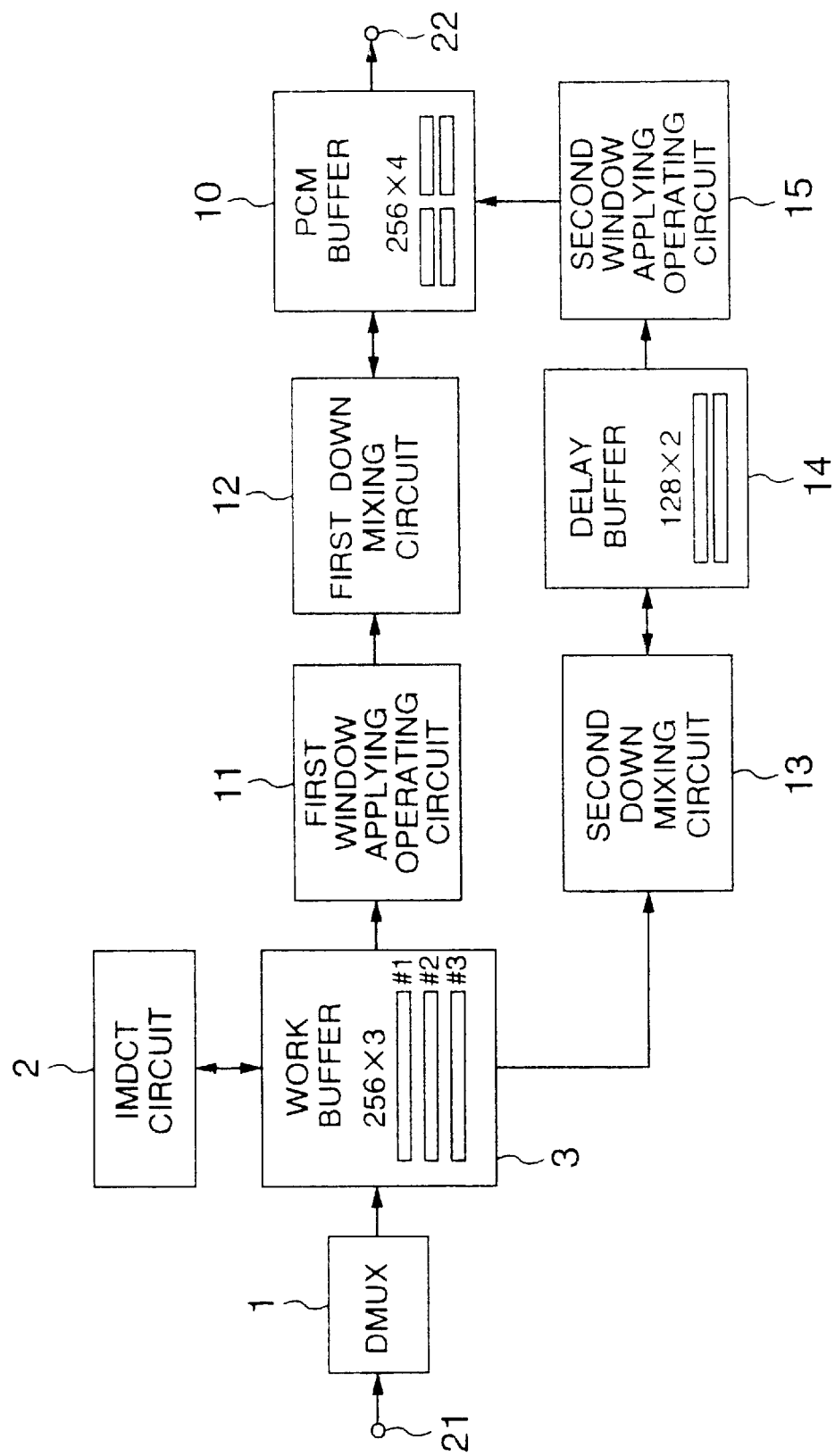
FIG. 15 is a diagram showing a constructional example of a hardware of an audio decoder according to the fifth embodiment of the invention.

The fifth embodiment of the invention will now be described. FIG. 15 is a diagram showing a constructional example of a hardware of an audio decoder according to the fifth embodiment and relates to a further modification of the construction according to the fourth embodiment shown in FIG. 14.

In the fourth embodiment, after the down mixing process was performed, the PCM data of a small channel number which is derived by such a down mixing process is stored into the PCM buffer 10, thereby enabling the memory capacity of the PCM buffer 10 to be reduced by an amount of only the down mixed data. The same shall also apply to the relation with the delay buffer 9.

In the fifth embodiment shown in FIG. 15, the processes are executed as follows. The audio data converted into the information of the time domain by the IMDCT circuit 2 is separated into the data of the portion which is not delayed (sample values at 256 points belonging to the latter half portion A in FIG. 13) and the data of the portion to be delayed (sample values at 256 points belonging to the latter half portion B in FIG. 13).

On the side which is not delayed, after the window applying arithmetic operation was performed by a first window applying operating circuit 11 in the ordinary manner, the down mixing process is performed by a first down mixing circuit 12. The overlap addition after completion of the window applying process is not executed in the first window applying operating circuit 11.

On the other hand, on the side to be delayed, the audio data which was frequency base to time base converted by the IMDCT circuit 2 is immediately down mixed by a second down mixing circuit 13 and only the audio data of a small channel number after completion of the down mixing process is stored into the delay buffer 14.

The audio data of two channels which was down mixed by the second down mixing circuit 13 by using the delay buffer 14 is subsequently supplied to a second window applying operating circuit 15 and is subjected to a window applying arithmetic operation. The PCM data comprising the sample values at 256 points which are derived by such an operation and the PCM data comprising the sample values at 256 points which are derived by the window applying arithmetic operation in the first window applying operating circuit 11 are overlap added and the resultant data is stored into the PCM buffer 10.

As mentioned above, in the fourth embodiment, the delay buffer 9 needs the memory capacity of (128×5) words, while in the fifth embodiment, it is sufficient to use the memory capacity of (128×2) words for the delay buffer 14 and the whole memory capacity of the audio decoder can be further reduced.

Figure 16:
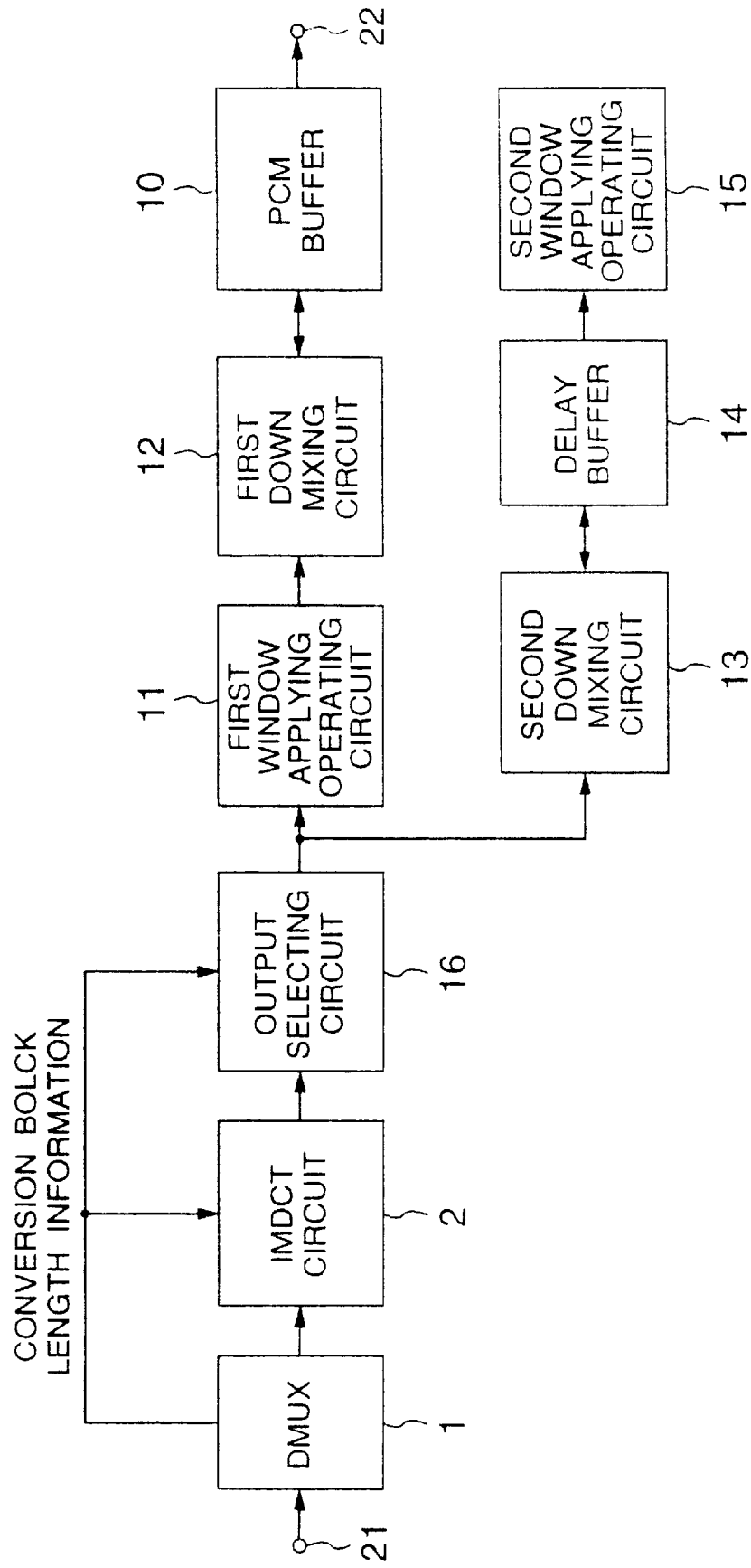
FIG. 16 is a block diagram showing a functional construction of the audio decoder according to the fifth embodiment as shown in FIG. 15.

FIG. 16 is a functional block diagram in which the hardware construction of the audio decoder according to the fifth embodiment shown in FIG. 15 is rewritten by being aware of a flow of processes.

The operation of the audio decoder according to the fifth embodiment will now be simply explained hereinbelow with reference to FIGS. 15 and 16.

The audio data which was separated into the audio data of each channel by the DMUX 1 in FIG. 16 and was inverse quantized every channel is temporarily stored into the work buffer 3 in FIG. 15.

If the DMUX 1, the IMDCT circuit 2, an output selecting circuit 16, the first window applying operating circuit 11, the first down mixing circuit 12, and the second down mixing circuit 13 as shown in FIG. 16 are cooperatively made operative, by merely using the first and second buffers #1 and #2 in the work buffer 3, the decoding processes of five channels can be pipeline operated without changing the processing time.

Even when the coupling method is used, by merely using three buffers comprising the foregoing two buffers #1 and #2 and the third buffer #3, the decoding processes of five channels can be pipeline operated.

The audio data which was frequency base to time base converted by the IMDCT circuit 2 is sent to the output selecting circuit 16 and is separated into the audio data which does not need to be delayed and the audio data which needs to be delayed. The audio data which does not need to be delayed is expressed by the following equation (5).

$$x(k) = \sum_{k=0}^{N/2-1} y(m)\cos[\pi(2k+1+n)(2m+1)/2N] \quad (5)$$

where, x(k): IMDCT processed signal
y(m): MDCT processed signal
N: conversion block length
n=N/2: phase term The number of signals x(k) which were IMDCT processed is equal to N. The number of signals y(m) which were MDCT processed is equal to N/2.

In the equation (5), with respect to k=N/4~N/2−1, now assuming that j=N/2−k−1, the equation can be modified as shown by the following equation (6) by using a symmetry of the cosine function.

$$\cos[\pi(2k+1+n)(2m+1)/2N] \quad (6)$$

-continued
= $\cos[\pi(2k+1+N/2)(2m+1)/2N]$
= $\cos[\pi(2k+1)(2m+1)/2N + \pi(2m+1)/4]$
= $\cos[\pi(2(N/2-j-1)+1)(2m+1)/2N + \pi(2m+1)/4]$
= $\cos[-\pi(2j+1)(2m+1)/2N + \pi(2m+1)/2 + \pi(2m+1)/4]$
= $cis[\pi(2j+1)(2m+1)/2N - 3\pi(2m+1)/4]$
= $-\cos[\pi(2j+1)(2m+1)/2N - 3\pi(2m+1)/4 + \pi(2m+1)]$
= $-\cos[\pi(2j+1)(2m+1)/2N + \pi(2m+1)/4]$ As will be obviously understood from the equation (6), the values which are really original are only the values in the portions of k=0~N/4−1.

The audio data which is needed to be delayed is expressed by the following equation (7).

$$x(k) = \sum_{k=N/2}^{N-1} y(m)\cos[\pi(2k+1+n)(2m+1)/2N] \quad (7)$$

By similarly modifying the equation (7), the values in only the portions of k=N/2~3N/4−1 are the original values. Therefore, it is sufficient to temporarily store only the data of the original portions of k=N/2~3N/4−1 into the delay buffer 14.

The audio data which is shown by the above equation (5) and does not need to be delayed is sent to the first window applying operating circuit 11. After the window function was applied to the values x(k) shown by the equation (5) by the first window applying operating circuit 11, the down mixing process is executed by the first down mixing circuit 12 and the PCM data produced by the down mixing process is stored into the PCM buffer 10.

The following equation (8) shows the contents of the processes in the first window applying operating circuit 11 and first down mixing circuit 12. In the equation (8), sch indicates a channel number before the down mixing process and dch denotes a channel number after the down mixing process.

$$(k = 0 \sim N/2 - 1) \quad (8)$$

for (sch = 0; sch < 5; sch++)

for (dch = 0; dch < 2; dch++)

$pcm\_buf[dch][k]+ = \alpha[sch][dch]w[k]x[sch][k]$

The audio data which is shown by the above equation (7) and needs to be delayed is sent to the second down mixing circuit 13. By executing the down mixing process (overwriting process of each channel data) by the second down mixing circuit 13, the number of channels is reduced from five channels to two channels and the down mixed data is stored into the delay buffer 14. The contents of the processes in the second down mixing circuit 13 are shown by the following equation (9).

$$(k = N/2 \sim 3N/4 - 1) \quad (9)$$

for (sch = 0; sch < 5; sch++)

for (dch = 0; dch < dch++)

$dlay\_buf[dch][k]+ = \alpha[sch][dch] \times [sch][k]$

The audio data temporarily stored in the delay buffer 14 is used to form the PCM data to be subsequently outputted. An arithmetic operating process for this purpose is executed by the second window applying operating circuit 15 just after the audio data of two channels was finally stored into the delay buffer 14 after completion of the down mixing process in the second down mixing circuit 13. An arithmetic operating equation of the process in the second window applying operating circuit 15 is shown by the following equation (10).

$$(k = N/2 \sim 3N/4 - 1) \quad (10)$$

$$\text{for } (dch = 0;\ dch < 2;\ dch++)$$

$$\{$$

$$pcm\_buf[dch][k]+ = w[k]\text{delay}\_buf[dch][k]$$

$$pcm\_buf[dch][k + N/4]+ = w[k + N/4]\text{delay}\_buf[dch][N/2 - k - 1]$$

$$\}$$

The PCM data formed by the above processes is temporarily stored into the PCM buffer 10 and, after that, it is outputted through the output terminal 22. The example of (256×4) words as a memory size of the PCM buffer 10 is shown in FIG. 15, this is because the PCM buffer 10 is used for the arithmetic operation and for the data output in a pipeline manner in order to output the PCM data at a predetermined rate. Therefore, it is sufficient to use the memory capacity of (256×2) words when the output at a predetermined rate is not considered.

Although the second to fifth embodiments have been described in detail above, in order to clarify a degree of capacity of the buffer memory which could be reduced in each embodiment, the results are shown in the following Table 1.

TABLE 1

|  | Memory capacity | Ratio to conventional one |
| --- | --- | --- |
| FIG. 10 (prior art) | 6400 words | 100% |
| 2nd embodiment | 4608 words | 72% |
| 3rd embodiment | 3968 words | 62% |
| 4th embodiment | 2432 words | 38% |
| 5th embodiment | 2048 words | 32% |

Although the case where the component requirements are sequentially limited from the second embodiment to the fifth embodiment has been described above, the techniques described in the embodiments can be respectively independently applied.

According to the second embodiment, as described above, the inverse quantizing process for every channel and the frequency base to time base converting process for every channel have been executed by the pipeline processes by using the work buffer. Therefore, when the pipeline processes are executed by the inverse quantizing means and the frequency base to time base converting means, one work buffer can be shared and the same buffer domain in the work buffer can be repetitively used many times. Consequently, the memory capacity of the buffer memories which is necessary to execute the series of decoding processes can be reduced almost without deteriorating the sound quality.

According to the third embodiment, by using the symmetry of the cosine function which the audio data converted into the information of the time domain has is used, and from one set of data values having the symmetry, the other data value is obtained and the window applying arithmetic operation is executed. Therefore, it is sufficient to store only one set of data value having the symmetry into the buffer memory for delaying the data which is used when the window applying arithmetic operation is executed. The memory capacity of the buffer memory for delaying the data can be reduced. Thus, the memory capacity of the buffer memories which is necessary to perform the series of decoding processes can be reduced almost without deteriorating the sound quality.

According to the fourth embodiment, the audio data of a plurality of channels produced by performing the window applying arithmetic operation by the window applying means is immediately down mixed and only the resultant data after completion of the down mixing process is stored into the buffer memory for outputting the data. Therefore, as compared with the prior art in which the audio data of a large channel number before the down mixing is stored as it is into the buffer memory, it is sufficient to prepare a number of buffer memories for outputting the data which number corresponds to the number of channels reduced by the down mixing. The memory capacity of the buffer memories which is necessary to execute the series of decoding processes can be reduced almost without deteriorating the sound quality.

According to the fifth embodiment, the audio data of a plurality of channels which was frequency base to time base converted is immediately down mixed and only the result after completion of the down mixing is stored into the buffer memory for delaying the data. Therefore, as compared with the prior art in which the audio data of a large channel number before the down mixing is stored as it is into the buffer memory for delaying the data, it is sufficient to prepare the buffer memories for delaying the data of only the number corresponding to the number of channels reduced by the down mixing. The memory capacity of the buffer memories which is necessary for performing the series of decoding processes can be reduced almost without deteriorating the sound quality.

What is claimed is:

1. An audio decoder for decoding encoded data including frequency domain audio data which represents audio signals of a plurality of channels in a frequency domain through a time base to frequency base conversion, comprising:

frequency domain down mixing means for processing said frequency domain audio data so as to mix the audio signals of said plurality of channels into the audio signals of a predetermined number of channels at a predetermined level ratio; and frequency base to time base converting means for converting the frequency domain audio data processed by said frequency domain down mixing means from the frequency domain to a time domain.

2. A decoder according to claim 1, wherein:

said frequency domain audio data includes sample data each having a variable bit length and indicative of a sample with respect to one of the audio signals of said plurality of channels; and said audio decoder further comprises inverse quantizing means for identifying the sample data by obtaining a bit length of each sample data from said frequency domain audio data and for supplying the identified sample data to said frequency domain down mixing means.

3. A decoder according to claim 1, wherein:

said frequency domain audio data has a data block of a variable length including data indicative of a variable number of samples of the audio signals of said plurality of channels;

said encoded data further includes block length information indicative of a length of each data block;

said audio decoder further comprises separating means for separating said frequency domain audio data and said block length information from said encoded data; and said frequency base to time base converting means converts the frequency domain audio data processed by said frequency domain down mixing means from the frequency domain to the time domain on the basis of the block length information separated by said separating means.

4. A decoder according to claim 3, further comprising:

block length matching means which operates in such a manner that when a length of data block to be processed by said frequency domain down mixing means differs with respect to the audio signals of said plurality of channels, the lengths of data blocks of the audio signals of said plurality of channels are made coincide and, after that, said data blocks are supplied to said frequency domain down mixing means.

5. A decoder according to claim 4, wherein said block length matching means includes:

second frequency base to time base converting means which operates in such a manner that when the length of data block with respect to the audio signal of at least one channel to be processed is different from the length of data block with respect to the audio signal of the other channel to be processed, a plurality of data blocks regarding the audio signal of said at least one channel are coupled so that said plurality of coupled data blocks have a length that is equal to the length of data block with respect to the audio signal of said other channel, and the frequency domain audio data included in said plurality of coupled data blocks is converted from the frequency domain to the time domain, thereby forming time domain audio data; and time base to frequency base converting means for forming second frequency domain audio data by converting said time domain audio data from the time domain to the frequency domain and for supplying said second frequency domain audio data to said frequency domain down mixing means.

6. A decoder according to claim 3, wherein when the length of data block with respect to the audio signal of at least one channel to be processed is different from the length of data block with respect to the audio signal of the other channel to be processed, said frequency domain down mixing means eliminates the audio signal of said at least one channel from targets to be mixed.

7. A decoder according to claim 1, wherein said frequency base to time base converting means converts said frequency domain audio data from the frequency domain to the time domain by using an MDCT (Modified Discrete Cosine Transform).

8. An audio decoder for decoding encoded data including frequency domain audio data which represents audio signals of a plurality of channels in a frequency domain through a time base to frequency base conversion, said frequency domain audio data including sample data each having a variable bit length and indicative of a sample with respect to one of the audio signals of said plurality of channels, said audio decoder comprising:

inverse quantizing means for obtaining a bit length of each sample data from said frequency domain audio data and identifying the sample data;

frequency base to time base converting means for converting the sample data identified by said inverse quantizing means from the frequency domain to a time domain; and a memory which is commonly used in an inverse quantizing process by said inverse quantizing means and in a frequency base to time base converting process by said frequency base to time base converting means;

wherein with respect to each of the audio signals of said plurality of channels, the inverse quantizing process by said inverse quantizing means and the frequency base to time base converting process by said frequency base to time base converting means are executed by a pipeline (processes) process.

9. A decoder according to claim 8, wherein:

said frequency domain audio data includes coupling data which is shared with respect to at least two of the audio signals of said plurality of channels; and said memory has an area to store said coupling data.

10. A decoder according to claim 8, wherein said frequency base to time base converting means converts said frequency domain audio data from the frequency domain to the time domain by using an MDCT (Modified Discrete Cosine Transform).

11. An audio decoder for decoding encoded data including frequency domain audio data which represents audio signals of a plurality of channels in a frequency domain through a time base to frequency base conversion, said audio decoder comprising:

frequency base to time base converting means for converting said frequency domain audio data from the frequency domain to a time domain by using a cosine function with respect to each of the audio signals of said plurality of channels, thereby forming a first set and a second set of time domain audio data having a symmetrical relation to each other derived from said cosine function;

a buffer memory for storing only one of the first and second sets of time domain audio data;

window applying means for obtaining, from said one of the first and second sets of time domain audio data stored in said buffer memory, the other of the first and second sets of time domain audio data by using said symmetrical relation and performing a window applying arithmetic operation.

12. A decoder according to claim 11, wherein said frequency base to time base converting means converts said frequency domain audio data from the frequency domain to the time domain by using an MDCT (Modified Discrete Cosine Transform).

13. An audio decoder for decoding encoded data including frequency domain audio data which represents audio signals of a plurality of channels in a frequency domain through a time base to frequency base conversion, said audio decoder comprising:

frequency base to time base converting means for converting said frequency domain audio data from the frequency domain to a time domain with respect to each of the audio signals of said plurality of channels, thereby forming time domain audio data;

window applying means for performing a window applying arithmetic operation for said time domain audio data;

down mixing means for processing the time domain audio data;

a buffer memory for temporarily storing the time domain audio data output from said down mixing means; and said down mixing means for adding the time domain audio data stored in said buffer memory to the time domain audio data output from said window applying means thereby mixing the audio signals of said plurality of channels into the audio signals of a predetermined number of channels at a predetermined level ratio and for outputting the added time domain audio data to said buffer memory.

14. A decoder according to claim 13, wherein:

said buffer memory includes an area to output the time domain audio data output from said down mixing means at a predetermined rate.

15. A decoder according to claim 13, wherein said frequency base to time base converting means converts said frequency domain audio data from the frequency domain to the time domain by using an MDCT (Modified Discrete Cosine Transform).

16. An audio decoder for decoding encoded data including frequency domain audio data which represents audio signals of a plurality of channels in a frequency domain through a time base to frequency base conversion, said audio decoder comprising:

frequency base to time base converting means for converting said frequency domain audio data from the frequency domain to a time domain with respect to each of the audio signals of said plurality of channels, thereby forming time domain audio data;

window applying means for performing a window applying arithmetic operation for said time domain audio data;

a buffer memory for delaying data which is used when said window applying means executes the window applying arithmetic operation; and down mixing means for adding the time domain audio data stored in said buffer memory to the time domain audio data output from said window applying means thereby mixing the audio signals of said plurality of channels into the audio signals of a predetermined number of channels at a predetermined level ratio and for outputting the added time domain audio data to said buffer memory.

17. A decoder according to claim 16, further comprising:

distributing means for separating said time domain audio data into a portion to be delayed and a portion not to be delayed when said window applying means executes the window applying arithmetic operation;

wherein said down mixing means processes only the portion to be delayed which was outputted from said distributing means and allows the processed portion to be stored into said buffer memory.

18. A decoder according to claim 16, wherein said frequency base to time base converting means converts said frequency domain audio data from the frequency domain to the time domain by using an MDCT (Modified Discrete Cosine Transform).

* * * * *